US012787323B2

(12) United States Patent
Lee et al.

(10) Patent No.: US 12,787,323 B2
(45) Date of Patent: Nov. 3, 2026

(54) MULTIPLE FIN DEVICE CONFIGURED TO OPERATE AS INDIVIDUAL TRANSISTOR AND METHOD

(71) Applicant: Micron Technology, Inc., Boise, ID (US)

(72) Inventors: Kyuseok Lee, Meridian, ID (US); Sangmin Hwang, Boise, ID (US); Byung Yoon Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 902 days.

(21) Appl. No.: 17/903,414

(22) Filed: Sep. 6, 2022

(65) Prior Publication Data

US 2024/0079474 A1 Mar. 7, 2024

(51) Int. Cl.
*H10D 12/00* (2025.01)
*H10D 12/01* (2025.01)

(52) U.S. Cl.
CPC ......... *H10D 12/038* (2025.01); *H10D 12/441* (2025.01)

(58) Field of Classification Search
CPC .... H10D 12/038; H10D 12/441; H10B 12/50; H10B 12/488
See application file for complete search history.

(56) References Cited

U.S. PATENT DOCUMENTS

| | | | | |
|---|---|---|---|---|
| 2015/0054058 | A1* | 2/2015 | Seol | H10D 30/693 257/324 |
| 2018/0374948 | A1* | 12/2018 | Naito | H10D 62/393 |
| 2021/0126098 | A1* | 4/2021 | Lee | H10B 12/488 |

* cited by examiner

*Primary Examiner* — Norman D Richards
*Assistant Examiner* — Ethan Edward Cutler
(74) *Attorney, Agent, or Firm* — Schwegman Lundberg & Woessner, P.A.

(57) ABSTRACT

Apparatus and methods are disclosed, including transistors, semiconductor devices and systems. Example semiconductor devices and methods include transistors formed from a plurality of semiconductor fins, and using a number of conductive lines passing through trenches between the fins to serve as a gate for the transistor.

12 Claims, 5 Drawing Sheets

MULTIPLE FIN DEVICE CONFIGURED TO OPERATE AS INDIVIDUAL TRANSISTOR AND METHOD

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface).

The present description relates generally to transistor structures in complementary metal oxide semiconductor (CMOS) devices and manufacture.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
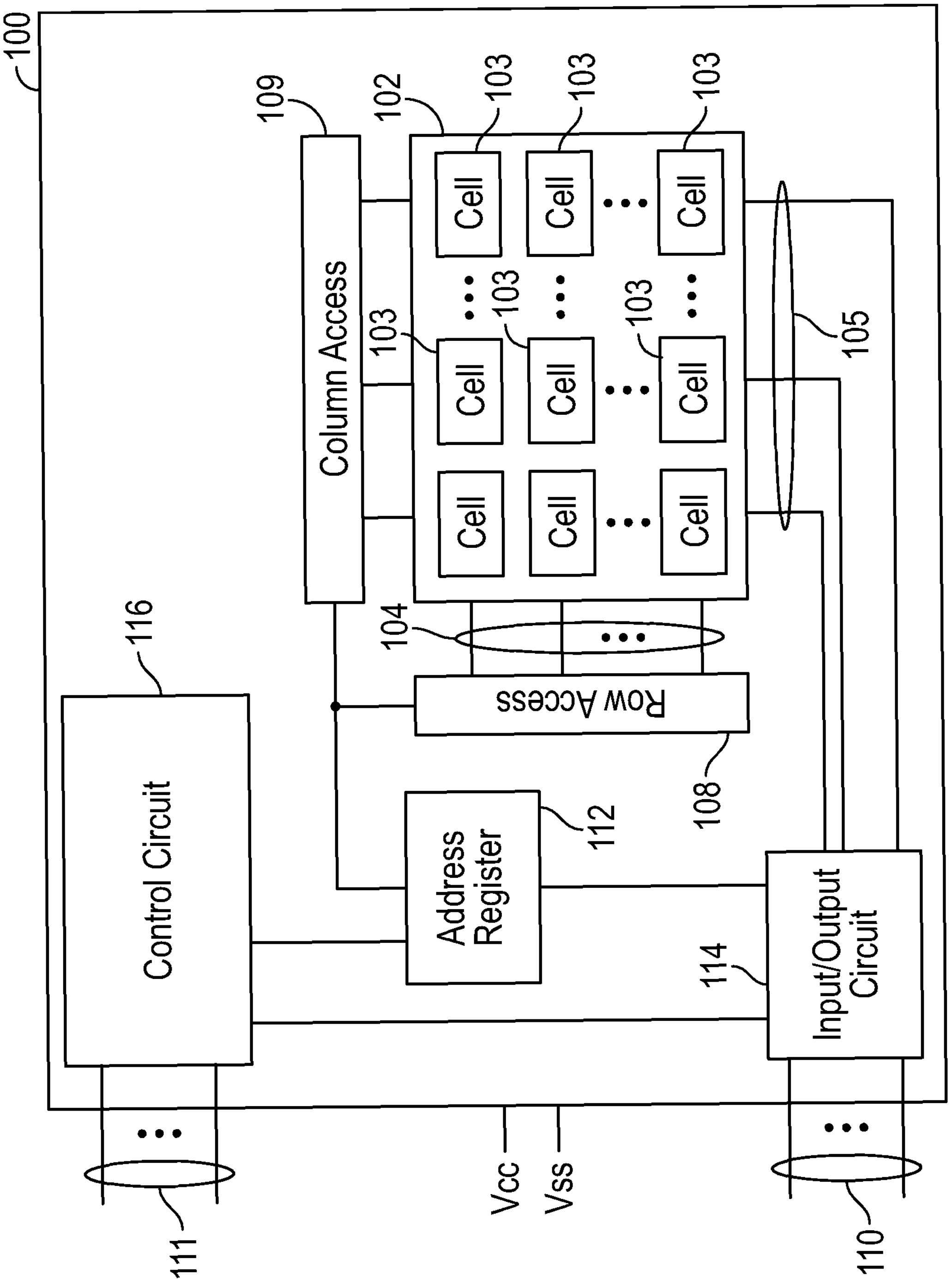
FIG. 1 illustrates a memory device in accordance with some example embodiments.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Memory cells 103 and other circuits 114, 116, etc. may include transistors and utilize methods as described in more detail in FIGS. 2-7. In one example, memory arrays 102 include NAND storage array, and peripheral circuits such as circuits 114, 116, 108, 109, etc. may include transistors as described in more detail in FIGS. 2-7.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

In one example, memory device 100 includes one or more transistors as described in examples below. In one example, the memory device 100 includes a sub-wordline driver device that includes one or more transistors as described in examples below.

One of ordinary skill in the art will recognize that memory device 100 may include other elements, several of which are not shown in FIG. 1, so as not to obscure the example embodiments described herein.

Figure 2:
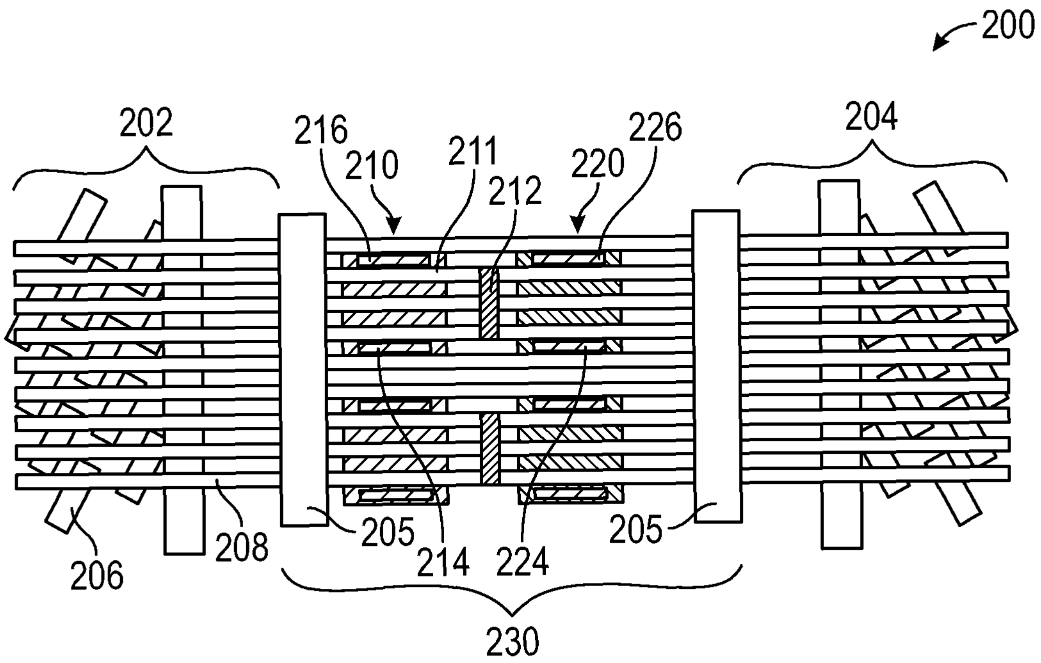
FIG. 2 illustrates a block diagram top view of a semiconductor device in accordance with some example embodiments.

FIG. 2 shows a top view of a semiconductor device 200 according to one example. The semiconductor device 200 includes a first portion 202 of an array of memory cells, and a second portion 204 of the array of memory cells. Individual memory cells 206 are shown in each portion 202, 204. As memory devices get larger, it can be technically challenging to drive larger arrays of memory cells effectively without degradation of a driven signal across the ever increasing number of memory cells in an array. One solution includes the use of sub-word line driver circuits within an array. A sub-word line driver can boost a driven signal to apply the desired signal more consistently across word lines in large memory arrays. Formation of transistors and arranging them to make up a sub-word line driver can be challenging.

FIG. 2 further shows a first transistor 210 and a second transistor 220 located between the a first portion 202 and the second portion 204 of the array of memory cells. In one example, the first transistor 210 and the second transistor 220 are components in a sub-word line driver circuit, although the invention is not so limited. Transistors such as first transistor 210 and second transistor 220 can also be used for any of a number of circuits that operate a memory device.

In the example of FIG. 2, the memory cells 206 are shown coupled together by a number of parallel wordlines 208. in one example, the number of parallel wordlines 208 are located laterally between semiconductor fins as described in more detail below. In one example, the number of parallel wordlines 208 are chopped to form electrically separate array portions 202, 204, and a sub wordline driver region 230. Trenches 205 provide the electrical separation for the chopped array portions 202, 204, and sub wordline driver region 230. Although trenches 205 form electrically separate portions of the number of parallel wordlines 208, deices such as a sub-wireline driver circuit may still be coupled indirectly to array portions 202, 204 in order to function as a sub-wordline driver.

The first transistor 210 includes a first source/drain region contact 214 and a second source/drain region contact 216. Similarly, the second transistor 220 includes a first source/drain region contact 224 and a second source/drain region contact 226. In one example, the first transistor 210 and the second transistor 220 include channels of opposite conductivity type (N-type, P-type). For illustration purposes, the first transistor 210 and the second transistor 220 are not shown configured in any specific configuration to form a circuit, however, one of ordinary skill in the art, having the benefit of the present disclosure, will recognize how to construct an appropriate circuit design to form a device such as a sub-wordline driver circuit.

FIG. 2 further shows a gate contact 212 coupled to more than one portion 211 of the number of parallel wordlines 208, where the portions 211 are within the sub wordline driver region 230. In one example, the gate contact 212 is used to activate a gate formed from the portions 211. In one example, a single gate contact 212 may couple to a gate of two or more adjacent transistors such as the first transistor 210 and the second transistor 220. In one example, a single gate contact 212 may couple to a gate of only one transistor.

Figure 3:
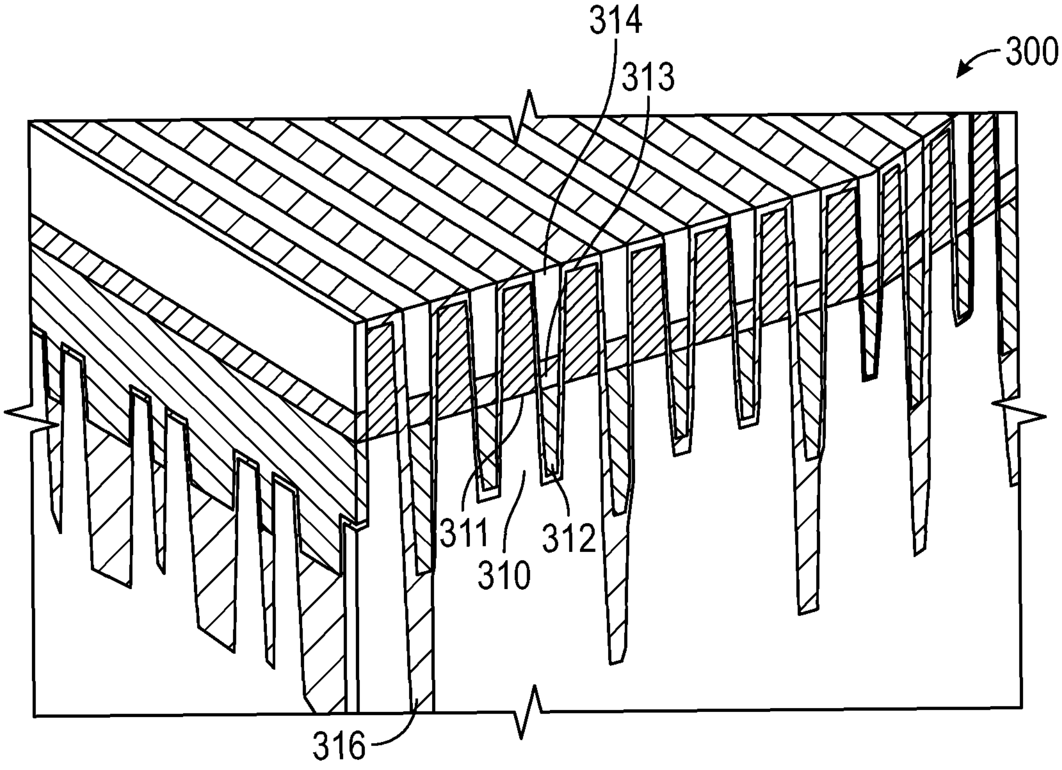
FIG. 3 illustrates an isometric cross section view of portions of a semiconductor device in accordance with some example embodiments.

FIG. 3 shows a cross section portion 300 of portion of a semiconductor device similar to the device 200 from FIG. 2. FIG. 3 shows a number of parallel wordlines 312 laterally between semiconductor fins 310. In one example, fins 310 are formed through a process such as lithographic patterning and etching. In one example, the number of parallel wordlines 312 are later deposited within trenches between the fins 310. In one example, the number of parallel wordlines 312 are formed from an electrically conductive material. One example includes titanium nitride, although the invention is not so limited.

In the example shown, the number of parallel wordlines 312 are formed within trenches, below a top 311 of the fins 310. In one example, the number of parallel wordlines 312 are planarized to have a top surface that is coplanar with the top 311 of the fins 310. In the example of FIG. 3, a polysilicon layer 313 is further formed over the number of parallel wordlines 312. In one example, a silicon nitride layer 314 is further formed over the polysilicon layer 313. In the example of FIG. 3, an isolation structure 316 is further included to laterally separate transistors from one another as described in more detail below. In one example, the isolation structure 316 is formed beneath one of the number of conductive lines 312. In one example, the isolation structure 316 is formed from an oxide, such as silicon oxide.

Figure 4:
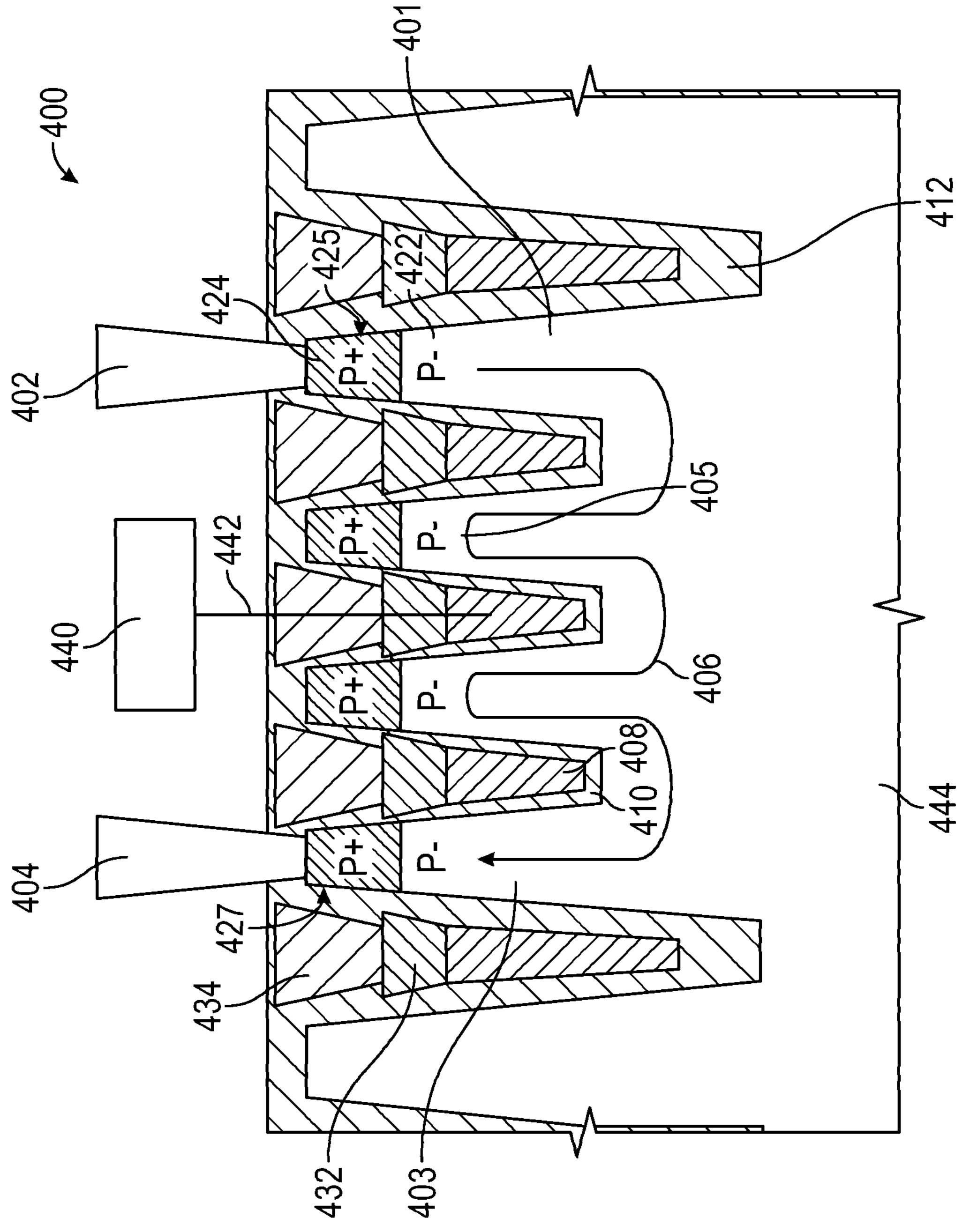
FIG. 4 illustrates a cross section of a transistor in accordance with some example embodiments.

FIG. 4 shows a side view cross section of a transistor 400 similar to transistor 210 or transistor 220 from FIG. 2. A first source/drain region contact 402 and a second source/drain region contact 404 are shown. In FIG. 4, a first source/drain region 425 is coupled to a top of a first fin 401 and a second source/drain region 427 is coupled to a top of a second fin 403. One or more middle fins 405 are located laterally between the first fin 401 and the second fin 403. In operation, a conduction channel 406 is illustrated between the first source/drain region 425 and the second source/drain region 427. In one example, a lightly doped layer 422 and a more heavily doped layer 424 operate together to form the first source/drain region 425. Similarly, in one example, the lightly doped layer 422 and more heavily doped layer 424 operate together to form the first source/drain region 427.

A number of conductive lines 408 are shown passing through trenches between the first fin 401, the second fin 403, and the one or more middle fins 405. The number of conductive lines 408 are further shown separated from the first fin 401, the second fin 403, and the one or more middle fins 405 by a gate dielectric layer 410.

In one example a semiconductor substrate 444 that is used to form fins such as the first fin 401, the second fin 403, and the one or more middle fins 405 includes an N-type substrate 444. In one example, the semiconductor substrate 444 includes a P-type substrate. In other examples, different wells may be formed adjacent to one another in order to form complementary conductivity type transistors adjacent to one another. For illustration, FIG. 4 only illustrates an N-type semiconductor substrate 444.

In the example of FIG. 4, P-type doped first and second source/drain regions 425, 427 are coupled on opposite sides of the channel 406 and operate as a transistor. In operation, the number of conductive lines 408 serve as a gate for the transistor 400 as they are located adjacent to the channel 406 and separated from the channel 406 by the gate dielectric 410. FIG. 4 further shows a gate contact 440 (similar to gate contact 212 from FIG. 2) coupled to one or more of the number of conductive lines 408 by circuitry 442. In this way, the channel 406 is switched on or off between the source/drain regions 425, 427.

In the example shown, isolation structures 412 are also employed to separate the transistor 400 from adjacent transistors or other adjacent circuitry. IN one example, the isolation structures 412 are formed beneath portions of some of the number of conductive lines 408.

One or more aspects of the transistor 400 of FIG. 4 provide a transistor with a wider effective gate width that allows scaling of a circuit such as a sub-wordline driver circuit to smaller form factors. The wider effective gate width allows the transistor 400 to operate at desired higher voltages for circuits such as sub-wordline drivers. Additionally, the configuration shown in FIG. 4 takes advantage of structures that are already used to form memory arrays such as semiconductor fins, and numbers of parallel wordlines. These structures are re-purposed to form gates and channels for transistors with desired operating characteristics such as wider effective gate widths.

Figure 5:
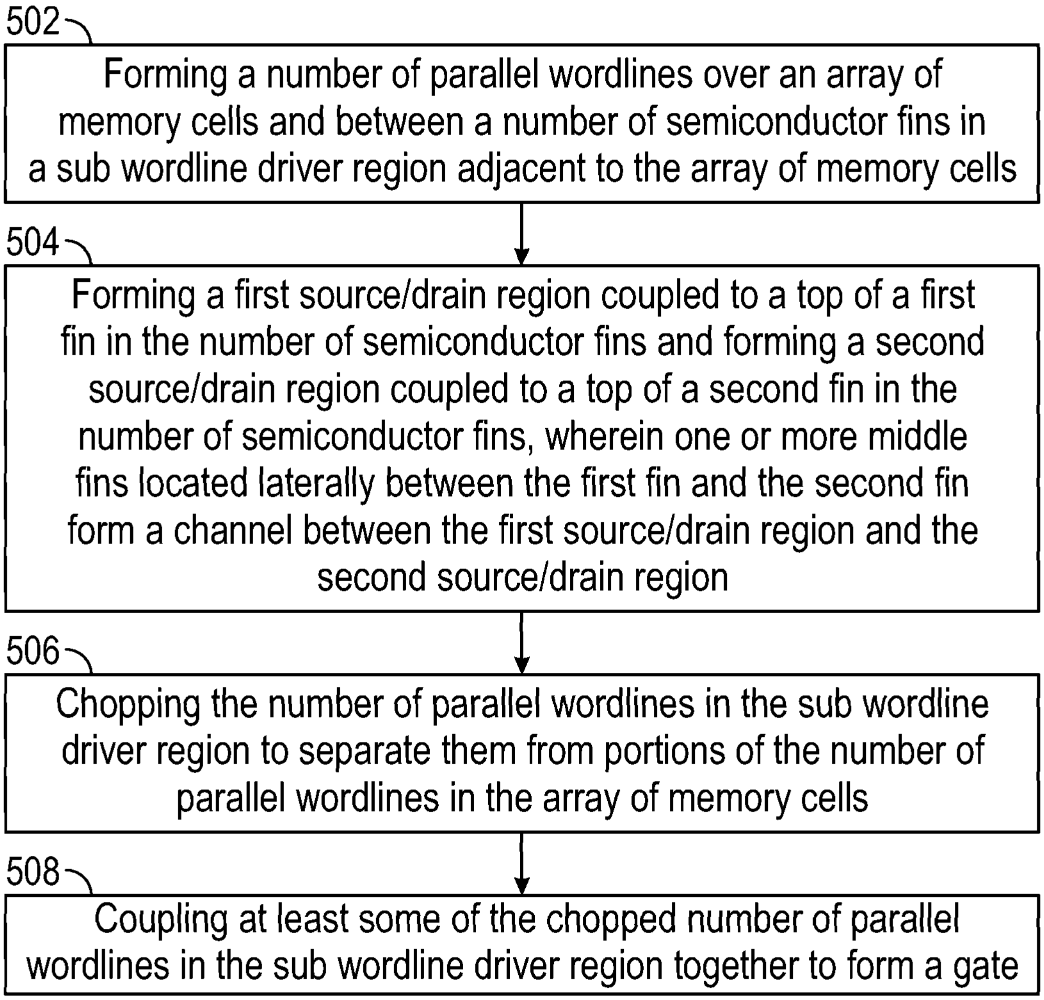
FIG. 5 illustrates an example method flow diagram in accordance with other example embodiments.

FIG. 5 shows a flow diagram of one example method of manufacture. In operation 502, a number of parallel wordlines are formed over an array of memory cells and between a number of semiconductor fins in a sub wordline driver region adjacent to the array of memory cells. In operation 504, a first source/drain region is coupled to a top of a first fin in the number of semiconductor fins and a second source/drain region is coupled to a top of a second fin in the number of semiconductor fins. In one example, one or more middle fins are located laterally between the first fin and the second fin form a channel between the first source/drain region and the second source/drain region. In operation 506, the number of parallel wordlines are chopped in the sub wordline driver region to separate them from portions of the number of parallel wordlines in the array of memory cells. In operation 508, at least some of the chopped number of parallel wordlines in the sub wordline driver region are coupled together to form a gate.

Figure 6:
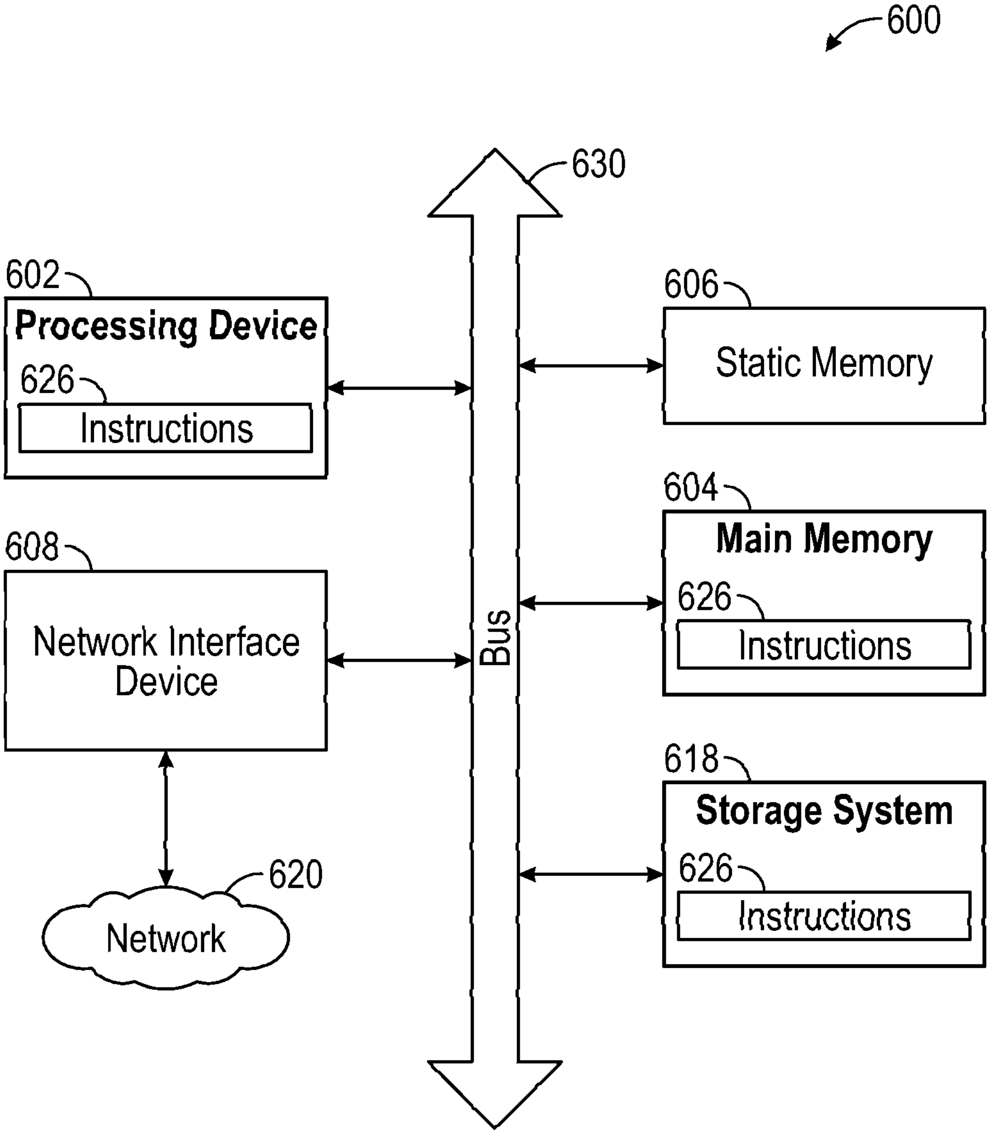
FIG. 6 illustrates an example block diagram of an information handling system in accordance with some example embodiments.

FIG. 6 illustrates a block diagram of an example machine (e.g., a host system) 600 which may include one or more transistors, memory devices and/or memory systems as described above. As discussed above, machine 600 may benefit from enhanced memory performance from use of one or more of the described transistor structures and/or memory systems, facilitating improved performance of machine 600 (as for many such machines or systems, efficient reading and writing of memory can facilitate improved performance of a processor or other components that machine, as described further below.

In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630. In one example, the main memory 604 includes one or more memory devices as described in examples above.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

Example 1 is a transistor. The transistor includes a first source/drain region coupled to a top of a first fin and a second source/drain region coupled to a top of a second fin. The transistor also includes one or more middle fins located laterally between the first fin and the second fin to form a channel between the first source/drain region and the second source/drain region. The transistor also includes a number of conductive lines passing through trenches between the first fin, the second fin, and the one or more middle fins, and a gate dielectric layer between the number of conductive lines and the first fin, the second fin, and the one or more middle fins.

In Example 2, the transistor of Example 1 optionally further includes silicon nitride layer over the number of conductive lines.

In Example 3, the transistor of any one of Examples 1-2 optionally includes wherein the number of conductive lines are located below the top of the first fin and the top of the second fin.

In Example 4, the transistor of any one of Examples 1-3 optionally further includes a gate contact coupled to more than one of the number of conductive lines.

In Example 5, the transistor of any one of Examples 1-4 optionally includes wherein the first fin, the second fin, and the middle fins are formed from a P-type substrate.

In Example 6, the transistor of any one of Examples 1-5 optionally includes wherein the first fin, the second fin, and the middle fins are formed from an N-type substrate.

In Example 7, the transistor of any one of Examples 1-6 optionally includes wherein the first and second source/drains includes a layer of lightly doped and a layer of heavy doped material of opposite conductivity type to the first fin, the second fin, and the middle fins.

In Example 8, the transistor of any one of Examples 1-7 optionally further includes an isolation structure on either side of the transistor formed beneath one of the number of conductive lines.

Example 9 is a semiconductor device. The semiconductor device includes an array of memory cells, including a number of parallel wordlines and a sub wordline driver located between portions of the array of memory cells. The semiconductor device also includes wherein the sub wordline driver includes one or more transistors that include a first source/drain region coupled to a top of a first fin and a second source/drain region coupled to a top of a second fin, and one or more middle fins located laterally between the first fin and the second fin to form a channel between the first source/drain region and the second source/drain region. The semiconductor device also includes wherein at least a portion of the number of parallel wordlines pass through trenches between the first fin, the second fin, and the one or more middle fins, and a gate dielectric layer between the portion of the number of parallel wordlines and the first fin, the second fin, and the one or more middle fins.

In Example 10, the semiconductor device of Example 9 optionally includes wherein the number of parallel wordlines are separated into an electrically separate array portion and a sub wordline driver portion.

In Example 11, the semiconductor device of any one of Examples 9-10 optionally includes wherein the one or more transistors includes a P-type transistor and an N-type transistor, and wherein the at least a portion of the number of parallel wordlines function as transistor gates.

In Example 12, the semiconductor device of any one of Examples 9-11 optionally further includes a gate contact coupled to multiple wordlines in the number of parallel wordlines.

Example 13 is a method. The method includes forming a number of parallel wordlines over an array of memory cells and between a number of semiconductor fins in a sub wordline driver region adjacent to the array of memory cells. The method also includes forming a first source/drain region coupled to a top of a first fin in the number of semiconductor fins and forming a second source/drain region coupled to a top of a second fin in the number of semiconductor fins, wherein one or more middle fins located laterally between the first fin and the second fin form a channel between the first source/drain region and the second source/drain region. The method also includes chopping the number of parallel wordlines in the sub wordline driver region to separate them from portions of the number of parallel wordlines in the array of memory cells, and coupling at least some of the chopped number of parallel wordlines in the sub wordline driver region together to form a gate.

In Example 14, the method of Example 13 optionally includes wherein forming a number of parallel wordlines includes forming a number of titanium nitride parallel wordlines.

In Example 15, the method of any one of Examples 13-14 optionally includes wherein forming a number of parallel wordlines includes forming a polysilicon layer over the titanium nitride parallel wordlines.

In Example 16, the method of any one of Examples 13-15 optionally includes wherein forming a number of parallel wordlines includes forming a silicon nitride layer over the polysilicon layer.

In Example 17, the method of any one of Examples 13-16 optionally further includes forming a gate oxide separating the number of semiconductor fins from the number of parallel wordlines in the sub wordline driver region.

In Example 18, the method of any one of Examples 13-17 optionally includes wherein forming a gate oxide includes forming a silicon oxide gate oxide.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A transistor, comprising:

a first source/drain region coupled to a top of a first fin and a second source/drain region coupled to a top of a second fin;

one or more middle fins located laterally between the first fin and the second fin to form a channel that extends from the first source/drain region, around the one or more middle fins, and on to the second source/drain region, wherein the one or more middle fins are uncoupled from transistor circuitry and are configured to operate as a single channel between the first source/drain region and the second source/drain region;

a number of conductive lines passing through trenches between the first fin, the second fin, and the one or more middle fins; and a gate dielectric layer between the number of conductive lines and the first fin, the second fin, and the one or more middle fins.

2. The transistor of claim 1, further including silicon nitride layer over the number of conductive lines.

3. The transistor of claim 1, wherein the number of conductive lines are located below the top of the first fin and the top of the second fin.

4. The transistor of claim 1, further including a gate contact coupled to more than one of the number of conductive lines.

5. The transistor of claim 1, wherein the first fin, the second fin, and the middle fins are formed from a P-type substrate.

6. The transistor of claim 1, wherein the first fin, the second fin, and the middle fins are formed from an N-type substrate.

7. The transistor of claim 1, wherein the first and second source/drains includes a layer of lightly doped and a layer of heavy doped material of opposite conductivity type to the first fin, the second fin, and the middle fins.

8. The transistor of claim 1, further including an isolation structure on either side of the transistor formed beneath one of the number of conductive lines.

9. A semiconductor device, comprising:

an array of memory cells, including a number of parallel wordlines;

a sub wordline driver located between portions of the array of memory cells;

wherein the sub wordline driver includes one or more transistors that include;

a first source/drain region coupled to a top of a first fin and a second source/drain region coupled to a top of a second fin;

one or more middle fins located laterally between the first fin and the second fin to form a channel that extends from the first source/drain region, around the one or more middle fins, and on to the second source/drain region, wherein the one or more middle fins are uncoupled from transistor circuitry and are configured to operate as a single channel between the first source/drain region and the second source/drain region;

wherein at least a portion of the number of parallel wordlines pass through trenches between the first fin, the second fin, and the one or more middle fins; and a gate dielectric layer between the portion of the number of parallel wordlines and the first fin, the second fin, and the one or more middle fins.

10. The semiconductor device of claim 9, wherein the number of parallel wordlines are separated into an electrically separate array portion and a sub wordline driver portion.

11. The semiconductor device of claim 10, wherein the one or more transistors includes a P-type transistor and an N-type transistor, and wherein at least a portion of the number of parallel wordlines function as transistor gates.

12. The semiconductor device of claim 9, further including a gate contact coupled to multiple wordlines in the number of parallel wordlines.

* * * * *